United States Patent
Okada et al.

(10) Patent No.: US 8,971,389 B2
(45) Date of Patent: Mar. 3, 2015

(54) MILLIMETER-WAVE BAND RADIO TRANSCEIVER DEVICE

(75) Inventors: Kenichi Okada, Tokyo (JP); Akira Matsuzawa, Tokyo (JP)

(73) Assignee: Tokyo Institute of Technology, Tokyo (JP)

( * ) Notice: Subject to any disclaimer, the term of this patent is extended or adjusted under 35 U.S.C. 154(b) by 0 days.

(21) Appl. No.: 13/985,657

(22) PCT Filed: Feb. 17, 2011

(86) PCT No.: PCT/JP2011/053402
§ 371 (c)(1),
(2), (4) Date: Oct. 3, 2013

(87) PCT Pub. No.: WO2012/111131
PCT Pub. Date: Aug. 23, 2012

(65) Prior Publication Data
US 2014/0016731 A1    Jan. 16, 2014

(51) Int. Cl.
*H04B 1/38* (2006.01)
*H04L 5/16* (2006.01)
*H04L 25/08* (2006.01)
*H03L 7/24* (2006.01)
(Continued)

(52) U.S. Cl.
CPC *H04L 25/08* (2013.01); *H03L 7/24* (2013.01); *H04B 1/40* (2013.01); *H03B 5/1228* (2013.01); *H03B 5/1212* (2013.01); *H03B 27/00* (2013.01); *H03B 5/1253* (2013.01)
USPC .......................................................... 375/219

(58) Field of Classification Search
USPC .................. 375/295, 316, 219, 326, 327, 340
See application file for complete search history.

(56) References Cited

U.S. PATENT DOCUMENTS 5,890,051 A * 3/1999 Schlang et al. ................. 455/76
2008/0238495 A1 * 10/2008 Tachibana et al. ............ 327/105
(Continued)

FOREIGN PATENT DOCUMENTS

JP    2006-094333    4/2006
JP    2008-205810    9/2008
(Continued)

*Primary Examiner* — Ted Wang
(74) *Attorney, Agent, or Firm* — Wells St. John P.S.

(57) ABSTRACT

Provided is a millimeter wavelength range transceiver device which can improve phase noise characteristics and which can also independently calibrate each respective local oscillator of a transmission unit and a reception unit. This millimeter wavelength range transceiver device comprises a transmission unit (10), a reception unit (20), and a reference frequency signal generator (30). The transmission unit (10) comprises a transmission-use local oscillator (11) comprising an injection-locked oscillator, a transmission-use mixer (12) for mixing the signal from the transmission-use local oscillator and a transmission baseband signal, and a transmission-use amplifier (13) for amplifying the signal from the transmission-use mixer to a transmission-use antenna (15). The reception unit (20) comprises a reception-use amplifier (25) for amplifying a signal from a reception-use antenna (24), a reception-use local oscillator (22) comprising an injection-locked oscillator, and a reception-use mixer (23) for mixing the signal from the reception-use local oscillator and the signal from the reception-use amplifier in order to output a reception baseband signal. A reference frequency signal generator (30) injects a reference frequency signal into the transmission-and-reception-use local oscillators (11 and 22).

6 Claims, 3 Drawing Sheets

(51) Int. Cl.
*H04B 1/40* (2006.01)
*H03B 5/12* (2006.01)
*H03B 27/00* (2006.01)

(56) References Cited

U.S. PATENT DOCUMENTS

2011/0003571 A1\* 1/2011 Park et al. .................. 455/258
2011/0110439 A1\* 5/2011 Miyaoka et al. ............. 375/259

FOREIGN PATENT DOCUMENTS

| JP | 2009-117894 | 5/2009 |
| JP | 2010-273283 | 12/2010 |
| WO | PCT/JP2011/053402 | 2/2011 |
| WO | WO 2012/111131 | 8/2012 |
| WO | PCT/JP2011/053402 | 1/2013 |

\* cited by examiner

MILLIMETER-WAVE BAND RADIO TRANSCEIVER DEVICE

CROSS REFERENCE TO RELATED APPLICATION

This application is a 35 U.S.C. §371 of and claims priority to PCT International Application No. PCT/JP2011/053402 which was filed on 17 Feb. 2011 (17.02.2011), the teachings of which are incorporated herein by reference.

TECHNICAL FIELD

The present invention relates to a millimeter-wave band radio transceiver device, and more particularly to a millimeter-wave band radio transceiver device that uses an injection-locked oscillator.

BACKGROUND ART

Currently, there is increasing demand for use of radio transceiver devices in mobile communications and the like; Improvements in communication quality and reliability are desired more than ever. As for radio transceiver devices of a millimeter-wave band (e.g. 60 GHz band), in order to simplify circuit configurations and reduce costs, what is proposed is a radio transceiver device of a direct conversion type that is designed to downconvert or upconvert the 60 GHz directly to a baseband. In general, such a radio transceiver device includes an amplifier, which amplifies a high-frequency signal, a mixer circuit, and a local oscillator. Among the above components, a signal from the local oscillator that generates a carrier signal influences the characteristics of the radio communication device. Therefore, improving phase noise of the local oscillator is a challenge in realizing a millimeter-wave band radio communication device.

Furthermore, in a radio communication device that uses a digital modulation method, two-phase sine wave outputs are used in a local oscillator: an I-component signal and a Q-component signal, which are different in phase from each other by 90 degrees. For example, if the above signals each are operated as differential signals, four-phase sine wave outputs are required in total. As for the structures of conventional four-phase sine-wave output local oscillators, for example, the following structures are available among other things: a structure that generates a signal that frequency is double an output frequency, and divides the frequency of the signal to offer four-phase outputs; a structure in which two two-phase sine-wave output oscillators are prepared and used in combination; and a structure in which a polyphase filter is used. It is technically difficult to realize any of the above structures because of problems such as I/Q mismatching.

As an oscillator, an injection-locked oscillator is available. For example, what is disclosed in Patent Document 1 is an injection-locked oscillator that oscillates at a frequency that is in synchronization with and an integer multiple of an injected reference frequency signal. If the phase noise of the reference frequency signal is low, it is possible to keep low the phase noise of an output signal of a frequency that is in synchronization with and an integer multiple of the reference frequency signal.

As for a radio transceiver device of a direct conversion type that does not require calibration for a mismatch between an I-component signal and a Q-component signal, for example, a radio transceiver device disclosed in Patent Document 2 is available. In this case, local oscillators are provided at a transmitter side and at a receiver side. Transmission takes place after a pilot signal is added at the transmitter side. The pilot signal is extracted at the receiver side. The signal is compared with template data that is prepared in advance. A shift adjustment of a 90-degree-shift phase shifter is made so as to be within an error range, so that the phase is adjusted to correct an I/Q mismatch.

PRIOR ART DOCUMENTS

Patent Documents

Patent Document 1: Japanese Patent Application Kokai Publication No. 2009-117894
Patent Document 2: Japanese Patent Application Kokai Publication No. 2008-205810

DISCLOSURE OF THE INVENTION

Problems to be Solved by the Invention

However, if an injection-locked oscillator, such as the one disclosed in Patent Document 1, is used as a local oscillator of a radio transceiver device, and particularly if a method of using I/Q-component signals is employed, the problem of I/Q mismatching cannot be solved. That is, an injection-locked oscillator is just used as a local oscillator without addressing the problem of I/Q mismatching.

The one disclosed in Patent Document 2 is required to add a pilot signal at the transmitter side and extract the pilot signal at the receiver side; template data needs to be prepared in advance. Furthermore, in Patent Document 2, there is no mention of a local oscillator; Patent Document 2 also lacks a concept of reducing phase noise in a high-frequency band such as millimeter-wave band.

In view of such circumstances, the present invention has been made to provide a millimeter-wave band radio transceiver device that can improve phase noise characteristics and can calibrate each of local oscillators of a transmitter unit and receiver unit independently.

Means for Solving the Problems

To achieve the above object of the present invention, a millimeter-wave band radio transceiver device of the present invention may include: a transmitter unit including a local oscillator for upconversion which is an injection-locked oscillator, an upconversion mixer which mixes a signal from the local oscillator for upconversion with a baseband signal for transmitter, and an amplifier for transmitter which amplifies a signal supplied from the upconversion mixer to an antenna for transmitter; a receiver unit including an amplifier for receiver which amplifies a signal from an antenna for receiver, a local oscillator for downconversion which is an injection-locked oscillator, and a downconversion mixer which mixes a signal from the local oscillator for downconversion with a signal from the amplifier for receiver to output a baseband signal for receiver; and a reference frequency signal generator injecting a reference frequency signal into the local oscillator for upconversion and the local oscillator for downconversion.

The millimeter-wave band radio transceiver device may include a calibration unit that separately adjusts the local oscillator for upconversion and the local oscillator for downconversion in such a way that the local oscillator for upconversion and the local oscillator for downconversion each are locked onto a reference frequency signal from the reference frequency signal generator.

In the millimeter-wave band radio transceiver device, the transmitter unit may transmit a modulation signal including orthogonal I- and Q-components, and the receiver unit may receive the modulation signal including orthogonal I- and Q-components.

The transmitter unit may include an I/Q combination-type quadrature oscillator for upconversion, and two upconversion mixers for I- and Q-components, and wires extending from the quadrature oscillator for upconversion to the two upconversion mixers may be equal in length with each other, and be arranged symmetrically with each other to reduce an I/Q mismatch; and the receiver unit may include an I/Q combination-type quadrature oscillator for downconversion, and two downconversion mixers for I- and Q-components, and wires extending from the quadrature oscillator for downconversion to the two downconversion mixers may be equal in length with each other, and be arranged symmetrically with each other to reduce an I/Q mismatch.

The reference frequency signal generator may use a PLL.

The transmitter unit and the receiver unit may be one of a direct conversion type, super-heterodyne type, or sliding IF type.

Advantages of the Invention

The advantage with the millimeter-wave band radio transceiver device of the present invention is that it is possible to improve phase noise characteristics, and calibrate each of local oscillators of the transmitter unit and receiver unit independently.

BEST MODE FOR CARRYING OUT THE INVENTION

Figure 1:
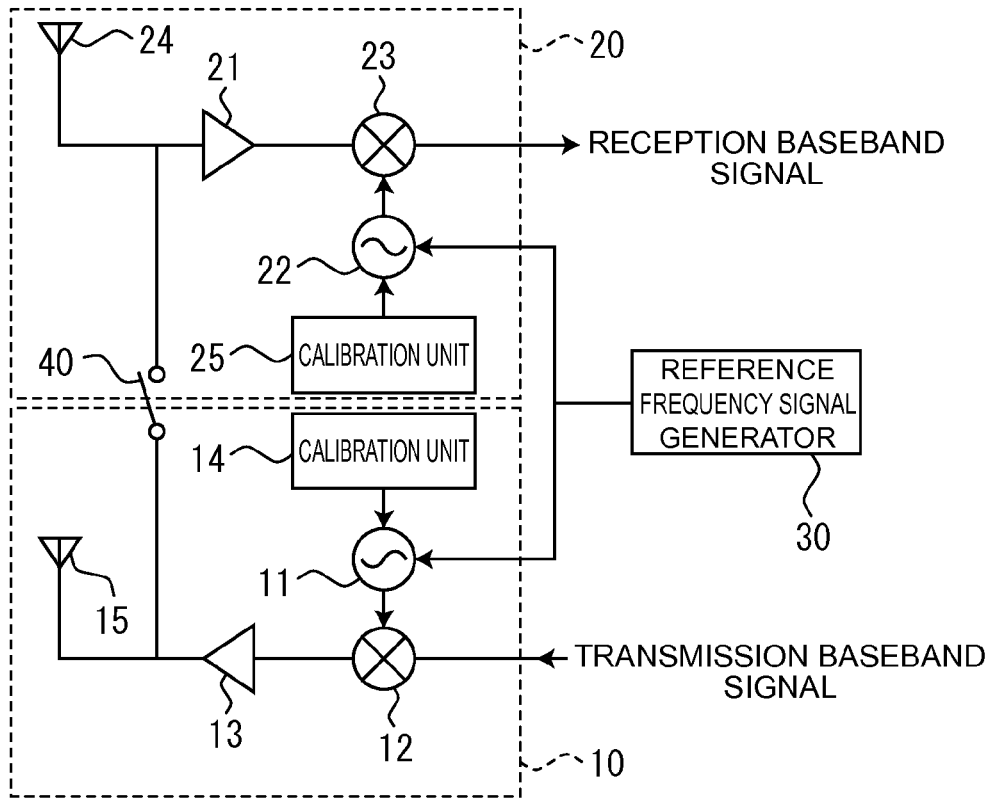
FIG. 1 is a schematic plane view of a millimeter-wave band radio transceiver device of the present invention.

Preferred embodiments of the present invention will be described below with reference to the accompanying drawings. FIG. 1 is a schematic plane view of a millimeter-wave band radio transceiver device of the present invention. As shown in the drawing, the millimeter-wave band radio transceiver device of the present invention mainly includes a transmitter unit 10, a receiver unit 20, and a reference frequency signal generator 30. A reference frequency signal generated by the reference frequency signal generator 30 is injected into a local oscillator for upconversion 11 of the transmitter unit 10 and a local oscillator for downconversion 22 of the receiver unit 20, which are described later. Incidentally, for the transmitter unit 10 and the receiver unit 20, the same circuit configuration basically may be used. In the following description, the transmitter unit 10 will be basically detailed; regarding the receiver unit 20, differences from the transmitter unit 10 will be primarily explained. In an example described below in the drawings, as for the transmitter unit 10 and the receiver unit 20, a radio transceiver device using a direct conversion method in which a frequency of a local oscillator is substantially equal to a frequency of a carrier wave will be mainly described. However, the present invention is no limited to the direct conversion method. As long as an injection-locked oscillator is used as a local oscillator in both the transmitter and receiver units, an intermediate frequency amplification stage (IF stage) may be provided. As for the IF-stage type, a super-heterodyne method, a sliding IF method, and the like may be used; the IF-stage type is not limited to a specific method. In the millimeter-wave band radio transceiver device shown in FIG. 1, only one baseband signal for transmitter and baseband signal for receiver are shown. However, the present invention is not limited to that configuration. If local oscillators are provided in both the transmitter and receiver units, the following configuration is available: the transmitter unit 10 for example transmits a modulation signal including orthogonal I- and Q-components, and the receiver unit 20 receives the modulation signal including orthogonal I- and Q-components. In the circuit configuration of a specific local oscillator described below, an I/Q combination-type orthogonal oscillator that outputs such I/Q-component signals is illustrated.

In the millimeter-wave band radio transceiver device of the present invention, the transmitter unit 10 mainly includes the local oscillator for upconversion 11, an upconversion mixer 12, and an amplifier for transmitter 13. The local oscillator for upconversion 11 is made up of an injection-locked oscillator (Injection Locked Oscillator). The injection-locked oscillator that constitutes the local oscillator for upconversion 11 is designed to multiply the frequency of a reference frequency signal injected from the reference frequency signal generator 30, which is described later, and output a high-frequency wave. In the case of a direct conversion type, an output from the local oscillator for upconversion 11 is a millimeter-wave band signal.

Figure 2:
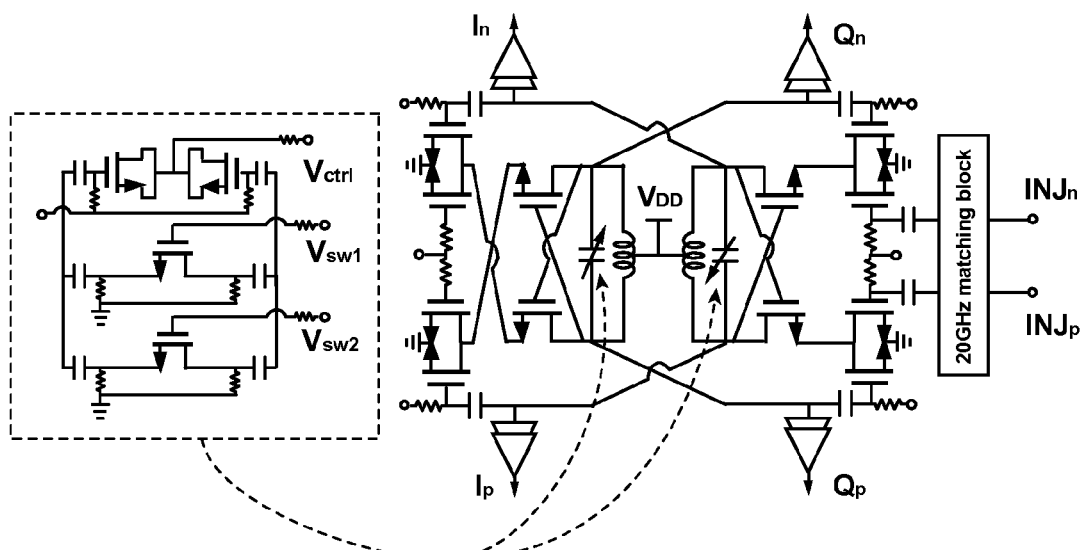
FIG. 2 is one example of the circuit configuration of a local oscillator for upconversion of a millimeter-wave band radio transceiver device of the present invention.

FIG. 2 shows one example of the circuit configuration of the local oscillator for upconversion 11. In the drawing, an injection-locked oscillator that can output four-phase sine waves is shown. That is, the local oscillator for upconversion 11 is an orthogonal oscillator of an I/Q combination type that sends I- and Q-component signals that are different in phase from each other by 90 degrees; and is one example of the circuit configuration of the case where each signal is operated as a differential signal. Incidentally, the millimeter-wave band radio transceiver device of the present invention is not limited to an injection-locked oscillator that can output four-phase sine waves as shown in the drawing. The millimeter-wave band radio transceiver device of the present invention may be of any structure as long as a millimeter-wave band signal can be output with the use of an injection-locked oscillator. If I/Q-component signals are output, the millimeter-wave band radio transceiver device is not limited to an I/Q combination-type orthogonal oscillator. For example, a local oscillator for oscillation of I-component signals, and a phase shifter for generation of Q-component signals may be used in combination to output I/Q-component signals.

As shown in the drawing, the local oscillator for upconversion 11 includes two injection terminals for differential signals, $INJ_n$ and $INJ_p$. To the injection terminals, an output of the reference frequency signal generator 30 is input. In the drawing, the injection-locked oscillator is an I/Q combination-type oscillator that outputs I- and Q-component signals that are different in phase by 90 degrees. In the injection-locked oscillator having the above configuration, an overall output frequency is determined based on two signals, which are I- and Q-component signals. For example, if a mismatch occurs between an oscillator for I-component signals and an oscillator for Q-component signals due to variations in production or the like, the oscillation frequency of each signal is changed, possibly causing a mismatch in I/Q phase balance. Therefore, for example, matching of the I/Q phase balance may be achieved by once cutting a link between I and Q, making individual oscillators oscillate, comparing an oscillation frequency for I-component signals with an oscillation frequency for Q-component signals, and adjusting a frequency control signal in such a way that both are equal. For the adjustment of individual oscillation frequencies, for example, a DAC (digital-analog converter) is used, and the bias of an oscillator may be adjusted by an analog signal that is output by a digital control signal, so that the oscillation frequencies can be adjusted.

The local oscillator for upconversion 11, which is made up of an injection-locked oscillator having the above configuration, is designed to use an output from the reference frequency signal generator 30 as an injection lock signal to multiply by N. For example, if the reference frequency signal generator 30 outputs a 20 GHz reference frequency signal, and if the 20 GHz reference frequency signal is injected into the injection-locked oscillator, the reference frequency signal is multiplied by three, and a 60 GHz signal is therefore generated. In this case, the local oscillator for upconversion 11 may be so adjusted as to output a signal that frequency is in the range of 57 GHz to 66 GHz in an unlocked state, for example. Such an adjustment enables outputting of a signal that is locked onto the reference frequency signal.

As shown in FIG. 1, to the local oscillator for upconversion 11, a calibration unit 14 may be connected to make an adjustment in such a way that the local oscillator for upconversion 11 is locked onto a reference frequency signal from the reference frequency signal generator 30. The calibration unit 14 for example includes a DAC (digital-analog converter); the oscillation frequency may be adjusted by adjusting the bias of an oscillator with the use of an analog signal that is output by a digital control signal.

The upconversion mixer 12 of the transmitter unit 10 is designed to mix a signal from the local oscillator for upconversion 11 with a baseband signal for transmitter. In order to superimpose a baseband signal for transmitter, which is information to be transmitted, on a signal from the local oscillator for upconversion 11, which is a carrier wave (carrier wave+ transmission information), the upconversion mixer 12 is used. The upconversion mixer 12 has a typical circuit configuration, and is not limited to a specific one.

The amplifier for transmitter 13 is designed to amplify a signal that is supplied from the upconversion mixer 12 to an antenna for transmitter 15. Therefore, at the final stage of the transmitter unit 10, a predetermined transmission power is obtained. The amplifier for transmitter 13 has a typical circuit configuration, and is not limited to a specific one.

An upconverted signal is emitted by the transmitter unit 10 having the above configuration from the antenna for transmitter 15.

Referring to FIG. 1 again, the receiver unit 20 mainly includes an amplifier for receiver 21, a local oscillator for downconversion 22, and a downconversion mixer 23. The amplifier for receiver 21 is designed to amplify a signal from an antenna for receiver 24. The amplifier for receiver 21 is effective particularly in case a signal received by the antenna for receiver 24 is weak. However, in cases such as when the input signal is sufficiently large, an amplifier in the first stage of the receiver unit 20 can be omitted. As in the case of the amplifier for transmitter 13, the amplifier for receiver 21 has a typical circuit configuration, and is not limited to a specific one.

The local oscillator for downconversion 22 may be an oscillator that has basically the same circuit configuration as the local oscillator for upconversion 11. That is, the system is so formed that the transmitter unit 10 corresponds to the receiver unit 20. Therefore, for example, if the local oscillator for upconversion 11 is an injection-locked oscillator that can output four-phase sine waves as shown in FIG. 2, the local oscillator for downconversion 22, too, may be an injection-locked oscillator that can output four-phase sine waves as shown in FIG. 2.

The downconversion mixer 23 is designed to mix a signal from the local oscillator for downconversion 22 with a signal from the amplifier for receiver 21, and outputs a baseband signal for receiver. Into the local oscillator for upconversion 11 and the local oscillator for downconversion 22, a reference frequency signal is injected from the same reference frequency signal generator 30. Therefore, with the use of the downconversion mixer 23, only the baseband signal for receiver, which is information that has been transmitted, can be extracted by subtracting the signal of the local oscillator for downconversion 22, i.e. the carrier wave, from the signal of the amplifier for receiver 21.

As shown in FIG. 1, even to the local oscillator for downconversion 22, as in the case of the local oscillator for upconversion 11, a calibration unit 25 may be connected to make an adjustment in such a way that the local oscillator for downconversion 22 is locked onto a reference frequency signal from the reference frequency signal generator 30. The calibration unit 25 for example includes a DAC (digital-analog converter); the oscillation frequency may be adjusted by adjusting the bias of an oscillator with the use of an analog signal that is output by a digital control signal.

A downconverted baseband signal for receiver is received by the receiver unit 20 having the above configuration.

It is preferred that the reference frequency signal generator 30, which injects a reference frequency signal into the local oscillator for upconversion 11 and the local oscillator for downconversion 22, be highly stable. The reason is that, if the phase noise of the reference frequency signal generator 30 is kept low, the phase noise of the local oscillator for upconversion 11 and the local oscillator for downconversion 22 can also be kept low. For example, the reference frequency signal generator 30 may be made up of a PLL (Phase Locked Loop). The PLL has a typical circuit configuration, and is not limited to a specific one. For example, in order to output a 20 GHz-band signal as a reference frequency signal from the PLL, a 36 MHz signal is input as a reference frequency from a crystal oscillator or the like to PLL, and the frequency of the signal is multiplied by 540 to 600, so that a reference frequency signal of about 20 GHz can be output. Incidentally, the present invention is not limited to a reference frequency signal generator that uses the PLL. The reference frequency signal generator may be of any configuration as long as the reference frequency signal can be output in a highly stable manner.

In the millimeter-wave band radio transceiver device of the present invention that has the above configuration, the injection-locked oscillators (the local oscillator for upconversion 11 and the local oscillator for downconversion 22) are respectively provided in the transmitter unit 10 and the receiver unit 20. Therefore, it is possible to separately calibrate each of the two injection-locked oscillators. That is, the synchronization frequency ranges of the transmitter and receiver sides can be adjusted in such a way that the injection-locked oscillators are locked onto the reference frequency signal. Furthermore, in the configuration in which I/Q-component signals are used, in each of the oscillators at the transmitter and receiver sides, matching of I/Q phase balance can be achieved separately.

Figure 3:
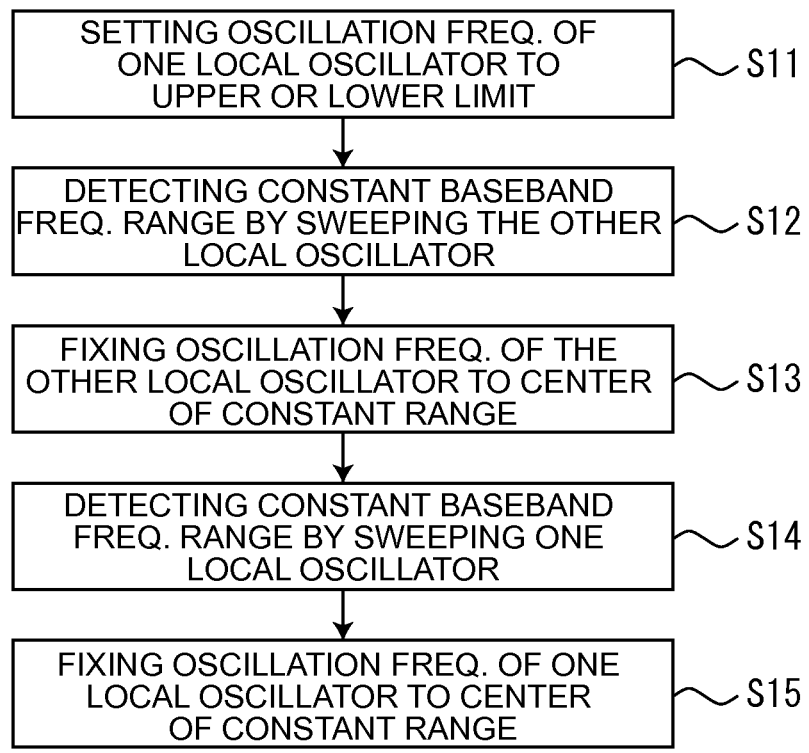
FIG. 3 is a flowchart illustrating the flow of calibration of a millimeter-wave band radio transceiver device of the present invention.

Using FIG. 3, the following describes the flow of calibration that is performed in such a way as to be locked onto a reference frequency signal in the millimeter-wave band radio transceiver device of the present invention. FIG. 3 is a flowchart illustrating the flow of calibration of the millimeter-wave band radio transceiver device of the present invention. Incidentally, when calibration is carried out, an output of the transmitter unit leaks to the receiver unit side via an antenna. Therefore, the baseband signal for receiver may be observed in this state. Furthermore, an output of the transmitter unit may be input directly into the receiver unit: For example, as shown in FIG. 1, a direct-connection switch 40 may be used to directly input a signal. When calibration is carried out, a predetermined DC component signal may be used as a baseband signal for transmitter. As a result, from the upconversion mixer 12, a sine wave signal of the local oscillator for upconversion 11 is output. Incidentally, in the configuration in which I/Q-component signals are used, before calibration is performed in such a way as to be locked onto a reference frequency signal, matching of I/Q phase balance may be carried out in advance.

Figure 4:
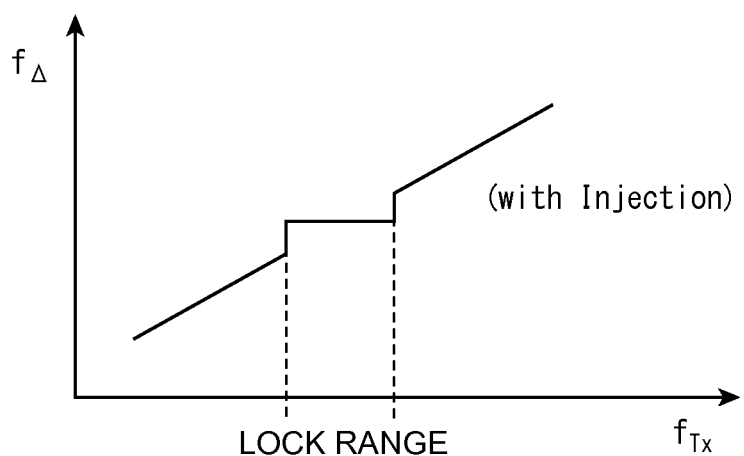
FIG. 4 is a graph showing one example of changes in a baseband frequency for receiver at a time when oscillation frequencies of a local oscillator for upconversion of a millimeter-wave band radio transceiver device of the present invention are swept from a lower limit to an upper limit.

As shown in the drawing, the oscillation frequency of one local oscillator is set to an upper limit or lower limit (Step S11). More specifically, for example, the calibration unit 25 that is connected to the local oscillator for downconversion 22 is used to set an oscillation frequency $f_{Rx}$ of the local oscillator for downconversion 22 to the upper limit. At this time, no reference frequency signal may be injected into the local oscillator for downconversion 22, and the local oscillator for downconversion 22 may be allowed to run freely. Then, the oscillation frequencies of the other local oscillator are swept from the lower limit to the upper limit to detect an oscillation frequency at which the baseband frequency becomes constant (Step S12). More specifically, with the reference frequency signal being injected into the local oscillator for upconversion 11, the calibration unit 14 that is connected to the local oscillator for upconversion 11 is used to sweep the oscillation frequencies $f_{Tx}$ of the local oscillator for upconversion 11 from the lower limit to the upper limit, thereby measuring baseband frequency $f_A=|f_{Rx}-f_{Tx}|$, and detecting a range of oscillation frequencies of the local oscillator for upconversion 11 where $f_A$ becomes constant. In order to sweep the oscillation frequencies $f_{Tx}$ from the lower limit to the upper limit, the calibration unit 14 may be used to sweep a signal that controls the oscillation frequencies. FIG. 4 is a graph showing one example of changes in baseband frequency $f_A$ for receiver at a time when oscillation frequencies of the local oscillator for upconversion 11 are swept from the lower limit to the upper limit. The measured $f_A$ varies as shown in FIG. 4. In a range where $f_A$ becomes constant, the local oscillator for upconversion 11 is locked onto a reference frequency signal of the reference frequency signal generator 30. Then, to a point near the center of the constant range, the oscillation frequency of the other local oscillator is fixed (Step S13). More specifically, the oscillation frequency of the local oscillator for upconversion 11 is set to a point near the center of the constant range. As a result, the transmitter-side injection-locked oscillator can be easily locked. Then, the oscillation frequencies of one local oscillator are swept from the lower limit to the upper limit, thereby detecting an oscillation frequency at which the baseband frequency becomes constant (Step S14). More specifically, the calibration unit 25 that is connected to the local oscillator for downconversion 22 is used to sweep the oscillation frequencies $f_{Rx}$ of the local oscillator for downconversion 22 from the lower limit to the upper limit, thereby similarly detecting a range of oscillation frequencies of the local oscillator for downconversion 22 where $f_A$ becomes constant. Finally, to a point near the center of the constant range, the oscillation frequency of one local oscillator is fixed (Step S15). More specifically, as in the case of the local oscillator for upconversion 11, as the oscillation frequency of the local oscillator for downconversion 22 is set to a point near the center of the constant range, the receiver-side injection-locked oscillator can be easily locked.

Incidentally, in the above-described example, the local oscillator for downconversion 22 is described as one local oscillator, and the local oscillator for upconversion 11 as the other local oscillator. However, the millimeter-wave band radio transceiver device of the present invention is not limited to the above. The reverse is also possible. Moreover, at step S14, at a time when the oscillation frequencies of one local oscillator are swept, the oscillation frequency of the other local oscillator may be set to the upper limit or lower limit, or may be a fixed oscillation frequency at step S13.

As described above, in the millimeter-wave band radio transceiver device of the present invention, the transmitter side and the receiver side each have one local oscillator. Therefore, it is possible to perform calibration by observing $f_A$ (the baseband frequency after downconversion is carried out), which is the difference between the oscillation frequencies. Therefore, there is no need to deal with high-frequency waves, and it is possible to easily observe with an inexpensive counter or the like. The above configuration is advantageous for the case where an I/Q combination-type orthogonal oscillator is for example used as a local oscillator. That is, in the case of the orthogonal oscillator, matching of I/Q phase balance is achieved; in this case, the phase balances of local oscillators at the transmitter and receiver sides are separately adjusted, and calibration is performed in such a way that it becomes easier for the local oscillators to be locked, so that a very flexible adjustment can be made.

Figure 5:
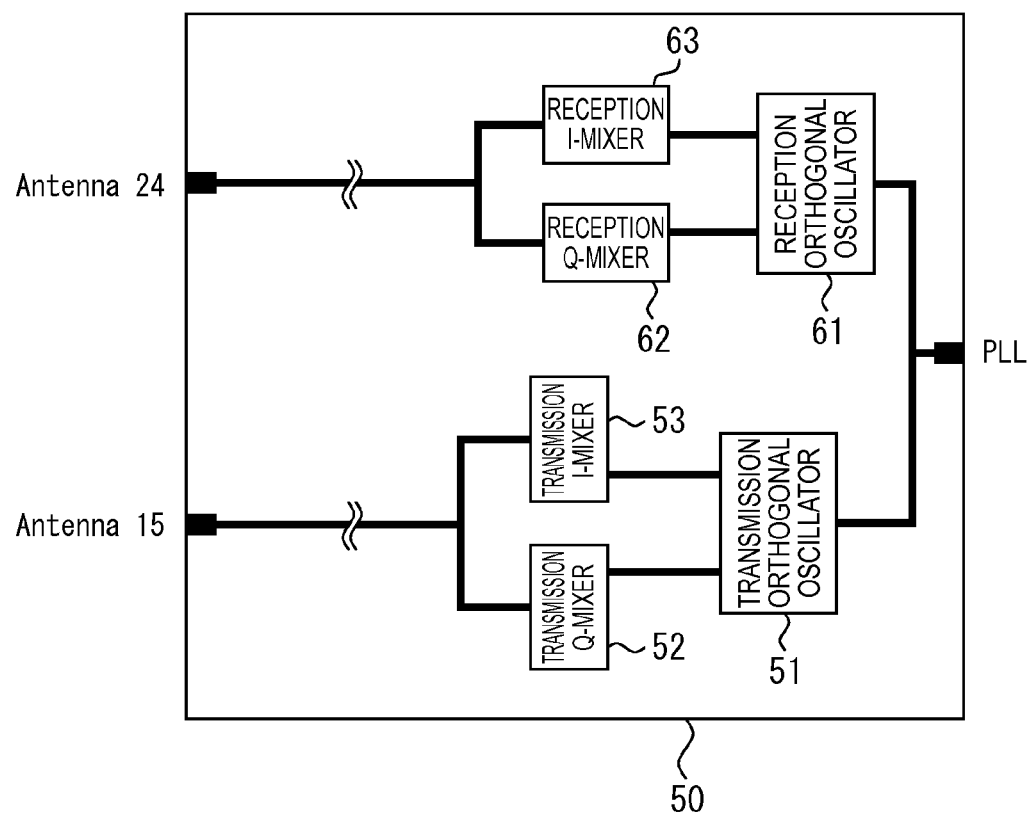
FIG. 5 is a schematic plane view illustrating how each component of a millimeter-wave band radio transceiver device of the present invention is disposed on a circuit board.

The following describes arrangement on a circuit board of the millimeter-wave band radio transceiver device of the present invention. FIG. 5 is a schematic plane view illustrating how each component of the millimeter-wave band radio transceiver device of the present invention is disposed on a circuit board. Incidentally, in the drawing, various small wiring patterns on the circuit board are omitted, and each component is shown as a simplified block. In the drawing, the portions with the same reference symbols as those shown in FIG. 1 represent the same components. The example is an example in which I/Q combination-type orthogonal oscillators are used as local oscillators. As described below, wires are made equal in length, thereby reducing mismatching of I/Q phase balance. That is, in the drawing, on a circuit board 50, a transmitter unit 10 of a millimeter-wave band radio transceiver device of the present invention includes an I/Q combination-type quadrature oscillator for upconversion 51, and two upconversion mixers 52 and 53 for I- and Q-components. A receiver unit 20 includes an I/Q combination-type quadrature oscillator for downconversion 61, and two downconversion mixers 62 and 63 for I- and Q-components. The wires extending from the quadrature oscillator for upconversion 51 to the two upconversion mixers 52 and 53 are equal in length with each other, and are arranged symmetrically with each other. Similarly, the wires extending from the quadrature oscillator for downconversion 61 to the two downconversion mixers 62 and 63 are equal in length with each other, and are arranged symmetrically with each other. In this manner, if the mixers for I- and Q-components exist, the mixers are so disposed that the wires become equal in length. As a result, it is possible to reduce an I/Q mismatch resulting from a difference in wire length.

Incidentally, the millimeter-wave band radio transceiver device of the present invention is not limited to those in the above examples shown in the diagrams. Needless to say, various modifications may be made without departing from the scope of the present invention.

EXPLANATION OF REFERENCE SYMBOLS

10: Transmitter unit
11: Local oscillator for upconversion
12: Upconversion mixer
13: Amplifier for transmitter
14: Calibration unit
15: Antenna for transmitter
20: Receiver unit
21: Amplifier for receiver
22: Local oscillator for downconversion
23: Downconversion mixer
24: Antenna for receiver
25: Calibration unit
30: Reference frequency signal generator
40: Switch
50: Circuit board
51: Quadrature oscillator for upconversion
52, 53: Upconversion mixer
61: Quadrature oscillator for downconversion
62, 63: Downconversion mixer

The invention claimed is:

1. A millimeter-wave band radio transceiver device using a millimeter-wave band carrier wave, the millimeter-wave band radio transceiver device comprising:
a transmitter unit transmitting a modulation signal including orthogonal I- and Q-components, the transmitter unit including a local oscillator for upconversion which is an I/Q combination-type quadrature oscillator having an injection-locked oscillator and two upconversion mixers for I- and Q-components which mix two signals of I- and Q-components from the local oscillator for upconversion, wherein wires extending from the quadrature oscillator for upconversion to the two upconversion mixers are equal in length with each other, and are arranged symmetrically with each other to reduce an I/O mismatch;
a receiver unit receiving the modulation signal including orthogonal I- and Q-components, the receiver unit including a local oscillator for downconversion which is an I/O combination-type quadrature oscillator having an injection-locked oscillator and two downconversion mixers for I- and Q-components which mix two signals of I- and Q-components from the local oscillator for downconversion, wherein wires extending from the quadrature oscillator for downconversion to the two downconversion mixers are equal in length with each other, and are arranged symmetrically with each other to reduce an I/O mismatch; and
a reference frequency signal generator injecting a reference frequency signal into the local oscillator for upconversion and the local oscillator for downconversion.

2. The millimeter-wave band radio transceiver device according to claim 1, in which the reference frequency signal generator uses a PLL.

3. The millimeter-wave band radio transceiver device according to claim 1, in which the transmitter unit and the receiver unit are of one of a direct conversion type, superheterodyne type, or sliding IF type.

4. A millimeter-wave band radio transceiver device using a millimeter-wave band carrier wave, the millimeter-wave band radio transceiver device comprising:
a transmitter unit including a local oscillator for upconversion which is an injection-locked oscillator, an upconversion mixer which mixes a signal from the local oscillator for upconversion with a baseband signal for transmitter, and an amplifier for transmitter which amplifies a signal supplied from the upconversion mixer to an antenna for transmitter;
a receiver unit including an amplifier for receiver which amplifies a signal from an antenna for receiver, a local oscillator for downconversion which is an injection-locked oscillator, and a downconversion mixer which mixes a signal from the local oscillator for downconversion with a signal from the amplifier for receiver to output a baseband signal for receiver;
a reference frequency signal generator injecting a reference frequency signal into the local oscillator for upconversion and the local oscillator for downconversion; and
a calibration unit that separately adjusts the local oscillator for upconversion and the local oscillator for downconversion in such a way that the local oscillator for upconversion and the local oscillator for downconversion each are locked onto a reference frequency signal from the reference frequency signal generator.

5. The millimeter-wave band radio transceiver device according to claim 4, in which the reference frequency signal generator uses a PLL.

6. The millimeter-wave band radio transceiver device according to claim 4, in which the transmitter unit and the receiver unit are of one of a direct conversion type, superheterodyne type, or sliding IF type.

* * * * *